United States Patent
Yin et al.

(10) Patent No.: US 9,337,384 B2
(45) Date of Patent: May 10, 2016

(54) LIGHT-EMITTING DIODE AND FABRICATION METHOD THEREOF

(71) Applicant: XIAMEN SANAN OPTOELECTRONICS TECHNOLOGY CO., LTD., Xiamen (CN)

(72) Inventors: Lingfeng Yin, Xiamen (CN); Suhui Lin, Xiamen (CN); Jiansen Zheng, Xiamen (CN); Chuangui Liu, Xiamen (CN); Yide Ou, Xiamen (CN); Qing Wang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 14/643,394

(22) Filed: Mar. 10, 2015

(65) Prior Publication Data

US 2015/0187990 A1    Jul. 2, 2015

Related U.S. Application Data

(63) Continuation of application No. PCT/CN2013/086615, filed on Nov. 6, 2013.

(30) Foreign Application Priority Data

Nov. 8, 2012    (CN) .......................... 2012 1 0443395

(51) Int. Cl.
| | |
|---|---|
| *H01L 33/00* | (2010.01) |
| *H01L 33/14* | (2010.01) |
| *H01L 33/40* | (2010.01) |
| *H01L 33/08* | (2010.01) |
| *H01L 33/32* | (2010.01) |

(52) U.S. Cl.
CPC ................ *H01L 33/14* (2013.01); *H01L 33/08* (2013.01); *H01L 33/40* (2013.01); *H01L 33/32* (2013.01); *H01L 2933/0016* (2013.01); *H01L 2933/0033* (2013.01)

(58) Field of Classification Search
CPC ......... H01L 33/08; H01L 33/14; H01L 33/32; H01L 33/40; H01L 2933/0016; H01L 2933/0033
USPC .......................................... 257/88, 99; 438/22
See application file for complete search history.

(56) References Cited

U.S. PATENT DOCUMENTS

| | | | | |
|---|---|---|---|---|
| 5,818,861 | A * | 10/1998 | Tan ........................ | H01S 5/0421 372/46.01 |
| 6,693,352 | B1 * | 2/2004 | Huang .................. | H01L 29/452 257/743 |
| 2005/0133809 | A1 | 6/2005 | Song et al. | |
| 2007/0085097 | A1 * | 4/2007 | Kim ....................... | B82Y 20/00 257/94 |

FOREIGN PATENT DOCUMENTS

CN    102169943 A    8/2011

* cited by examiner

*Primary Examiner* — Jae Lee
*Assistant Examiner* — Colleen E Snow
(74) *Attorney, Agent, or Firm* — Syncoda LLC; Feng Ma; Junjie Feng

(57) ABSTRACT

A light-emitting diode includes a substrate; a light-emitting epitaxial layer, laminated by semiconductor material layers and formed over the substrate; a first current spreading layer over the light-emitting epitaxial layer; an adhesive layer with alternating second current spreading layers and first metal barrier layers over the first current spreading layer, including three structure layers; a second metal barrier layer over the adhesive layer with alternating second current spreading layers and metal barrier layers; and a metal electrode layer over the second metal barrier layer.

14 Claims, 4 Drawing Sheets

LIGHT-EMITTING DIODE AND FABRICATION METHOD THEREOF

CROSS-REFERENCE TO RELATED APPLICATIONS

The present application is a continuation of, and claims priority to, PCT/CN2013/086615 filed on Nov. 6, 2013, which claims priority to Chinese Patent Application No. 201210443395.3 filed on Nov. 8, 2012. The disclosures of these applications are hereby incorporated by reference in their entirety.

BACKGROUND

After years of development, the light-emitting diode (LED) has been widely applied in different fields like display, indication, back light and lighting. Conventional P-type III-V group semiconductor material has poor current spreading performance. To enable even injection of current into the light-emitting layer, a current spreading layer is added over the p-type material layer. Among many materials as current spreading layer (TCL) to improve the current spreading effects like ITO, CTO, InO and ZnO, the ITO (Indium Tin Oxide) is most widely applied. The ITO film refers to indium tin oxide semiconductor transparent conducting film, and the ITO meets two index requirements, namely low resistivity and high light transmittance. Compared with other transparent semiconductor conducting films, ITO has good chemical stability, heat stability, good adhesiveness to substrate and pattern processing property.

With reference to FIG. 1, a conventional light-emitting diode structure, comprising a substrate 100, a first confinement layer 101, a light-emitting layer 102, a second confinement layer 103, a current spreading layer 104, a P electrode 105 (comprising a first metal barrier layer 107, a second metal barrier layer 108 and a metal surface layer 109) laminated from bottom to up, an N electrode 106 (comprising a first metal barrier layer 110, a second metal barrier layer 111 and a metal surface layer 112) over the exposed surface of the first confinement layer 101. However, poor adhesiveness of the current spreading layer and the P electrode is easily to cause film stripping between them, which may influence LED reliability and product yield.

SUMMARY

To solve the above problems, the present disclosure provides a light-emitting diode with alternating adhesive layer electrode and fabrication method thereof.

According to a first aspect of the present disclosure, a light-emitting diode, comprising: a substrate; a light-emitting epitaxial layer, laminated by semiconductor material layers and formed over the substrate; a first current spreading layer over the light-emitting epitaxial layer; an adhesive layer with alternating a second current spreading layers and a first metal barrier layers over the first current spreading layer; a second metal barrier layer over the adhesive layer with alternating second current spreading layers and first metal barrier layers; and a metal electrode layer over the second metal barrier layer.

The adhesive layer with alternating second current spreading layers and first metal barrier layers comprises three structure layers, wherein: the first layer comprises second current spreading layers; the second layer comprises alternating second current spreading layers and first metal barrier layers, and the third layer comprises first metal barrier layers.

In some implementations, the first current spreading layer is about 500-5000 Å thick.

In some implementations, the first layer is about 100-800 Å thick.

In some implementations, the second layer is about 50-200 Å thick.

In some implementations, the third layer is about 100-500 Å thick.

In some implementations, the adhesive layer with alternating second current spreading layers and first metal barrier layers is fabricated by magnetron sputtering.

In some implementations, the adhesive layer with alternating second current spreading layers and first metal barrier layers has 6-20 alternating layers.

In some implementations, the first current spreading layer is made of one or any combination of ITO, ZnO, CTO, InO, In-doped ZnO, Al-doped ZnO or Ga-doped ZnO.

In some implementations, the material of the second current spreading layer is same as the first current spreading layer.

In some implementations, the first metal barrier layer is made of any of Cr, Ti, Pt, Ni or W.

In some implementations, the second metal barrier layer is made of any of Cr, Ti, Pt, Ni or W.

According to a second aspect of the present disclosure, a light-emitting diode fabrication method, comprising: providing a substrate; growing a light-emitting epitaxial layer laminated by semiconductor material layers via epitaxial growth; forming a first current spreading layer over the light-emitting epitaxial layer; forming an adhesive layer with alternating a second current spreading layers and a first metal barrier layers over the first current spreading layer by magnetron sputtering; forming a second metal barrier layer over the first metal barrier layer; forming a metal electrode layer over the second metal barrier layer; and taking annealing heat treatment.

In some implementations, the method includes the adhesive layer with alternating second current spreading layers and first metal barrier layers comprises three structure layers, wherein: the first layer comprises second current spreading layers; the second layer comprises alternating second current spreading layers and first metal barrier layers, and the third layer comprises first metal barrier layers.

In some implementations, the method includes forming the first layer by magnetron sputtering at 0.1-1 Å/s deposition rate; and the first layer is about 100-800 Å thick.

In some implementations, the method includes forming the second layer by magnetron sputtering at 0.1-0.5 Å/s deposition rate; and the second layer is about 50-200 Å thick.

In some implementations, the method includes forming the third layer by magnetron sputtering at 0.1-1 Å/s deposition rate; and the third layer is about 100-500 Å thick.

In some implementations, the method includes taking annealing heat treatment at 200-400° C.

In another aspect, a lighting-emitting system is provided including a plurality of light-emitting diodes disclosed herein. The system can also include other types of LEDs and components. The other features and advantages of this present disclosure will be described in detail in the following specification, and it is believed that such features and advantages will become more obvious in the specification or through implementations of this invention.

DETAILED DESCRIPTION

According to various embodiments, a light-emitting diode and fabrication method thereof are provided. The LED includes a substrate, a light-emitting epitaxial layer, a first current spreading layer, an adhesive layer with alternating second current spreading layers and first metal barrier layers, a second metal barrier layer and a metal electrode layer.

The adhesive layer comprises three structure layers, wherein: the first layer comprises second current spreading layers; the second layer comprises non-completely continuous alternating second current spreading layers and first metal barrier layers, and the third layer comprises first metal barrier layers. The adhesive layer can be fabricated by magnetron sputtering for easy control of deposition rate. Annealing heat treatment is followed after sputtering. During annealing heat treatment, the first metal barrier layer at the second layer appearing non-completely continuous film shape is thin and has gap, making it easy for the second current spreading layer at the second layer to grow laterally and longitudinally and to form crystalline; the middle is intruded by portion of the first metal barrier layer at the second layer, thus mixing the second current spreading layer and the first metal barrier layer at the second layer together after several times of alternating. The first layer (the second current spreading layer) is same or similar in material with the first current spreading layer, with good adhesiveness. The adhesive layer with alternating second current spreading layers and first metal barrier layers has better adhesiveness to the first current spreading layer than the pure metal barrier layer and current spreading layer film, thus eliminating electrode dropping proportion of the LED and improving operating reliability of LED.

With reference to the descriptions above, the following embodiments disclose an LED and fabrication method thereof, wherein, the light-emitting diode comprises: a substrate; an epitaxial layer, laminated by semiconductor material layers and formed over the substrate; a first current spreading layer over the light-emitting epitaxial layer; an adhesive layer with alternating second current spreading layers and first metal barrier layers over the first current spreading layer; a second metal barrier layer over the adhesive layer with alternating second current spreading layers and metal barrier layers; and a metal electrode layer over the second metal barrier layer. The adhesive layer with alternating second current spreading layers and first metal barrier layers comprises three structure layers, wherein: the first layer comprises second current spreading layers; the second layer comprises alternating second current spreading layers and first metal barrier layers, and the third layer comprises first metal barrier layers.

Figure 4:
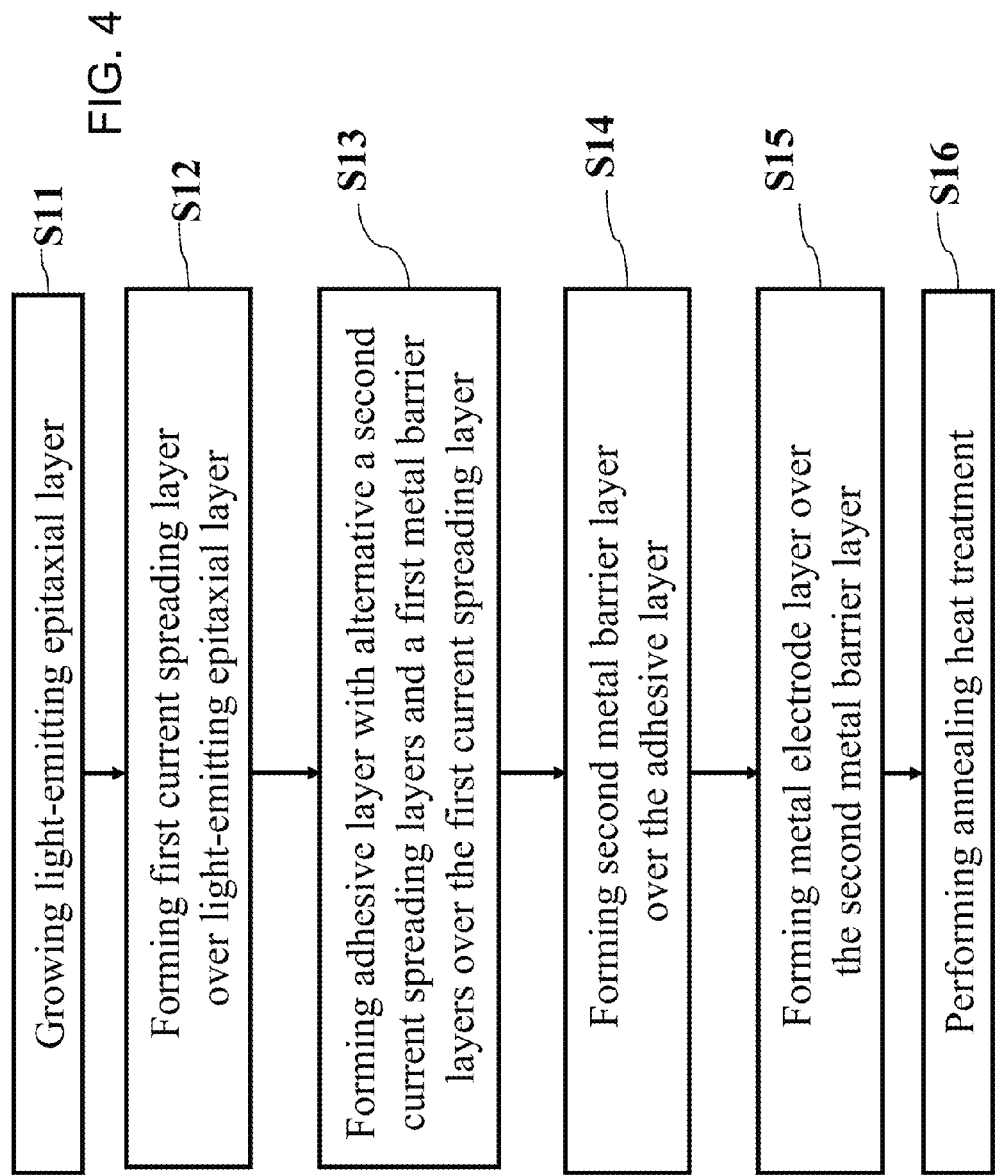
FIG. 4 is a flow diagram of a method of fabricating a light-emitting diode chip with an alternating-adhesive-layer electrode according to some embodiments.

Further, in combination with the above LED structure, as shown in FIG. 4, the following embodiments also provide a fabrication method, comprising: Step S11, providing a substrate; growing a light-emitting epitaxial layer via epitaxial growth, successively comprising a first confinement layer, a light-emitting layer, a second confinement layer; Step S12, forming a first current spreading layer over the light-emitting epitaxial layer; Step S13, forming an adhesive layer with alternating a second current spreading layers and a first metal barrier layers over the first current spreading layer; Step S14, forming a second metal barrier layer over the adhesive layer with alternating second current spreading layers and first metal barrier layers; and Step S15, forming a metal electrode layer over the second metal barrier layer; and Step S16, taking annealing heat treatment.

Detailed description will be given to the light-emitting diode structure and fabrication method thereof below.

Figure 1:
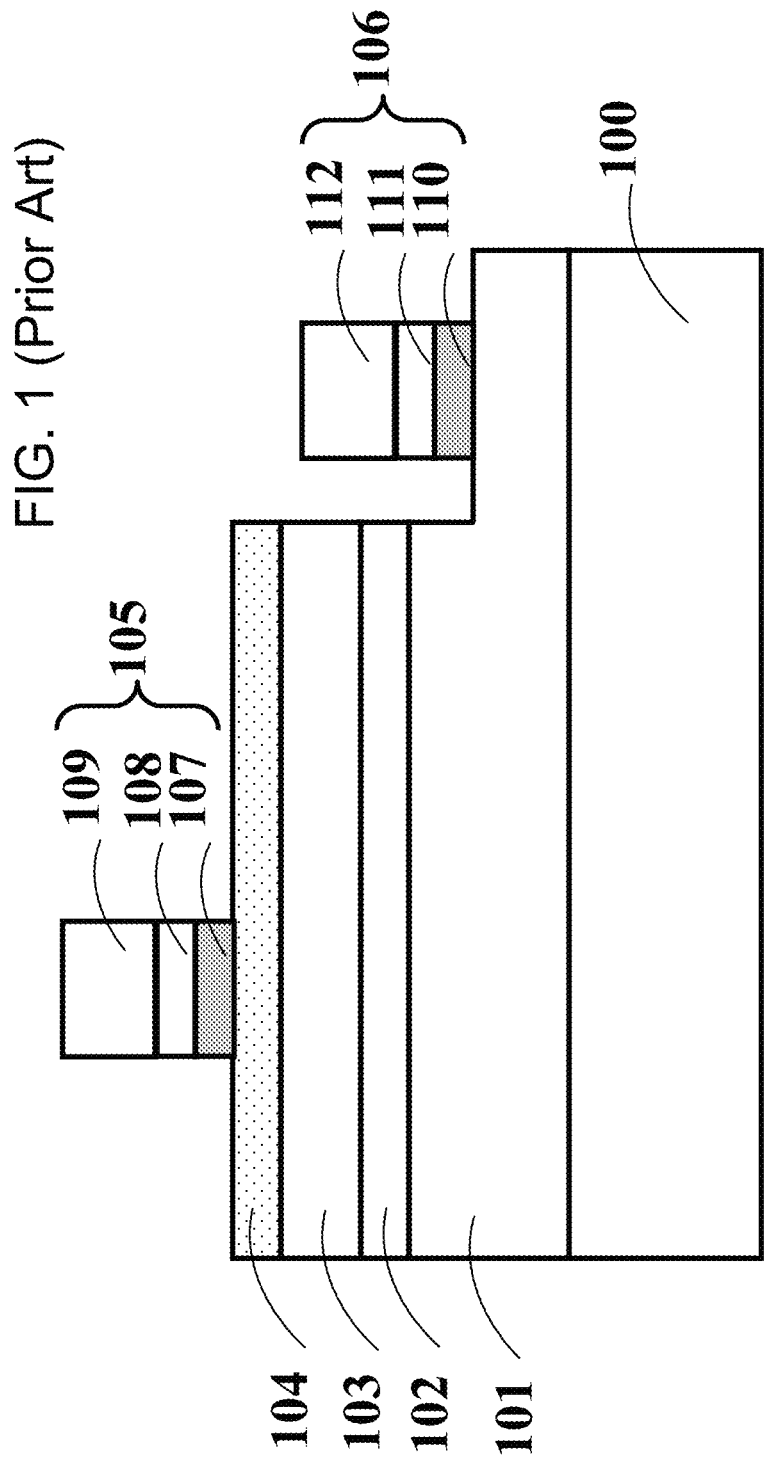
FIG. 1 is a structural diagram of a conventional light-emitting diode chip.
Figure 2:
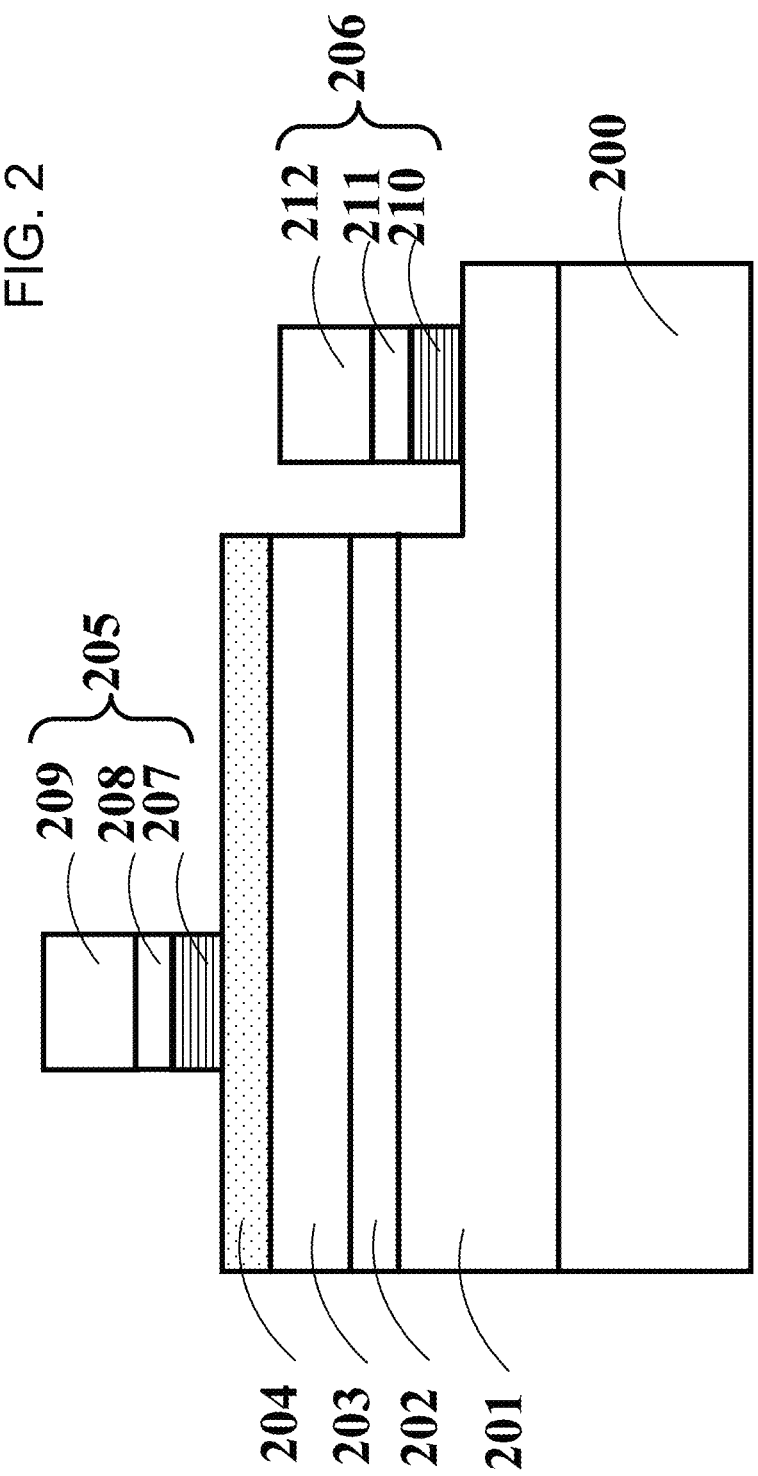
FIG. 2 is a structural diagram of a light-emitting diode chip with alternating adhesive layer electrode according to some embodiments.

Refer to FIG. 2, a structural section view of Embodiment 1 of the present disclosure.

As shown in FIG. 2, in this embodiment, the substrate 200 can be selected from a group of materials including: sapphire substrate, SiC substrate, Si substrate, GaN substrate or ZnO substrate. In preferred embodiments, the substrate 200 is a sapphire substrate.

The epitaxial layer, which can be GaN-based, GaP-based, GaNP-based or ZnO-based material, is deposited over the substrate 200. In this embodiment, the epitaxial layer is made of GaN-based material and comprises a first confinement layer 201, a light-emitting layer 202 and a second confinement layer 203 laminated from bottom to up, wherein, the first confinement layer 201 is an N-type GaN layer structure; the light-emitting layer 202 is an AlGaN multi-quantum well active layer, and the second confinement layer 203 is a P-type AlGaN layer. In this embodiment, the epitaxial layer structure is not limited to buffer layer, N-type GaN layer structure, AlGaN multi-quantum well active layer and P-type AlGaN layer. Other epitaxial layer structures capable of light emitting, e.g., N-type GaN layer, (InGaN)/GaN multi-quantum well active layer and P-type GaN layer, are also included in the present disclosure. A first current spreading layer 204, made of any of ITO, ZnO, CTO, InO, In-doped ZnO, Al-doped ZnO or Ga-doped ZnO, is formed over the second confinement layer 203. In this embodiment, ITO is used with thickness of 2300 Å.

The adhesive layer with alternating second current spreading layers and first metal barrier layers 207 is over the first current spreading layer 204; and the adhesive layer with alternating second current spreading layers and first metal barrier layers 210 is over the first confinement layer 201.

Figure 3:
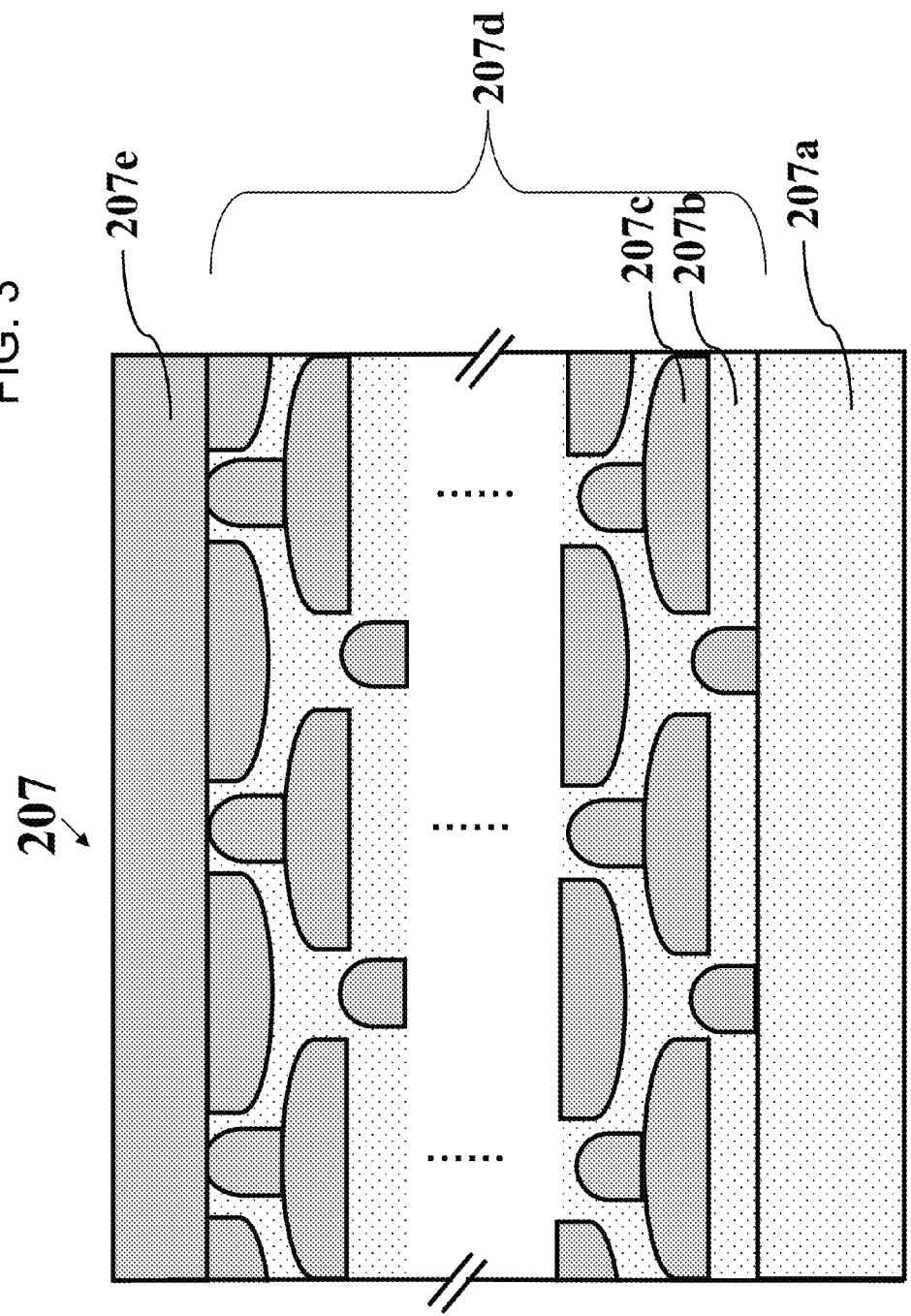
FIG. 3 is a structural diagram of an alternating-adhesive-layer electrode according to some embodiments.

As shown in FIG. 3, the adhesive layer with alternating second current spreading layers and first metal barrier layers 207 comprises three structure layers (210 and 207 have same material and thickness, the three structures of which are not illustrated in the figure); the first layer 207a comprising second current spreading layers is made of ITO, same as the first current spreading layer 204; it is 300 Å thick and has deposition rate of magnetron sputtering of 0.1-1 Å/s; the second layer 207d comprises alternating second current spreading layers and first metal barrier layers; wherein, first, depositing the 10 Å ITO second current spreading layer 207b at 0.1-0.5 Å/s deposition rate of magnetron sputtering; depositing the 10 Å first metal barrier layer 207c made of Cr at 0.1-0.5 Å/s deposition rate of magnetron sputtering, repeating for 5 times to fabricate 10 alternating layers; the third layer 207e comprises first metal barrier layers made of Cr with 300 Å thickness and 0.1-1 Å/s deposition rate of magnetron sputtering.

The second metal barrier layers 208 and 211 are made of Pt, which are formed over the adhesive layers with alternating second current spreading layers and first metal barrier layers 207 and 210 respectively; the metal surface layers 209 and 212 made of Au are formed over the second metal barrier layers 208 and 211 respectively. In this way, the adhesive layer 207 with alternating first metal barrier layers, the second metal barrier layer 208 and the metal surface layer 209 comprise the P electrode 205; and the adhesive layer 210 with alternating first metal barrier layers, the second metal barrier layer 211 and the metal surface layer 212 comprise the N electrode 206.

The P electrode 205 and the N electrode 206 are over the surfaces of the first current spreading layer 204 and the exposed first confinement layer 201 respectively, providing current injection for the epitaxial layer. In addition, if the embodiment has a vertical-structure LED, the N electrode can be directly arranged at the substrate back. The substrate is conducting, e.g., Si wafer.

Descriptions of the LED fabrication method will be given below. Refer to FIG. 4, a flow diagram of LED fabrication method according to the present disclosure.

In Step S11, provide a substrate 200 and form a light-emitting epitaxial layer over the substrate 201 via metal-organic chemical vapor deposition (MOCVD). The epitaxial layer comprises a first confinement layer 201, a light-emitting layer 202 and a second confinement layer 203 laminated from bottom to up.

In Step S12, form a 2300 Å thick first current spreading layer 204 with ITO over the light-emitting epitaxial layer.

In Step S13, form an adhesive layer with alternating second current spreading layers and first metal barrier layers over the first current spreading layer 204, wherein, the adhesive layer with alternating second current spreading layers and first metal barrier layers 207 comprises three structure layers; the first layer 207a comprising second current spreading layers is made of ITO, same as the first current spreading layer 204; it is 600 Å thick and has deposition rate of magnetron sputtering of 0.1-1 Å/s; the second layer 207d comprises alternating second current spreading layers and first metal barrier layers; wherein, first, depositing the 10 Å ITO second current spreading layer 207b at 0.1-0.5 Å/s deposition rate of magnetron sputtering; depositing the 10 Å first metal barrier layer 207c made of Cr at 0.1-0.5 Å/s deposition rate of magnetron sputtering, repeating for 5 times to fabricate 10 alternating layers; the third layer 207e comprises first metal barrier layers made of Cr with 150 Å thickness and 0.1-1 Å/s deposition rate of magnetron sputtering.

In Step S14, form a second metal barrier layer with Pt over the adhesive layer with alternating second current spreading layers and first metal barrier layers. In Step S15, form a metal electrode layer with Au over the second metal barrier layer.

In step S16, take annealing heat treatment at 200-400° C. Before annealing heat treatment, the first metal barrier layer at the second layer appearing non-completely continuous film distribution is thin, making it easy for the second current spreading layer at the second layer to grow laterally and longitudinally and to form crystalline; the middle is intruded by portion of the first metal barrier layer at the second layer, thus mixing the second current spreading layer and the first metal barrier layer at the second layer together after several times of alternating. The first layer (the second current spreading layer) is same in material with the first current spreading layer, with good adhesiveness. The adhesive layer with alternating second current spreading layers and first metal barrier layers has better adhesiveness to the first current spreading layer than the pure metal barrier layer and current spreading layer film with an increasing adhesiveness between the P electrode and the current spreading layer, thus eliminating electrode dropping proportion of the LED and improving operating reliability of LED.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light-emitting diode comprising:
   a substrate;
   a light-emitting epitaxial layer formed over the substrate;
   a first current spreading layer over the light-emitting epitaxial layer;
   an adhesive layer with alternating second current spreading layers and first metal barrier layers over the first current spreading layer;
   wherein the adhesive layer includes:
      a first layer including a second current spreading layers;
      a second layer including alternating the second current spreading layers and a first metal barrier layers; and
      a third layer including the first metal barrier layers;
   a second metal barrier layer over the adhesive layer; and
   a metal electrode layer over the second metal barrier layer.

2. The light-emitting diode of claim 1, wherein the first current spreading layer has a thickness of about 500-5000 Å.

3. The light-emitting diode of claim 1, wherein the first layer has a thickness of about 100-800 Å.

4. The light-emitting diode of claim 1, wherein the second layer has a thickness of about 50-200 Å.

5. The light-emitting diode of claim 1, wherein the third layer has a thickness of about 100-500 Å.

6. The light-emitting diode of claim 1, wherein the adhesive layer comprises about 6-50 alternating layers.

7. The light-emitting diode of claim 1, wherein the second current spreading layer is composed of a same material as the first current spreading layer.

8. A light-emitting system comprising a plurality of light-emitting diode, each light-emitting diode including:
   a substrate;
   a light-emitting epitaxial layer formed over the substrate;
   a first current spreading layer over the light-emitting epitaxial layer;
   an adhesive layer with alternating second current spreading layers and first metal barrier layers over the first current spreading layer;
   wherein the adhesive layer includes:
      a first layer including a second current spreading layers;
      a second layer including alternating the second current spreading layers and a first metal barrier layers; and
      a third layer including the first metal barrier layers;
   a second metal barrier layer over the adhesive layer; and
   a metal electrode layer over the second metal barrier layer.

9. The system of claim 8, wherein the first current spreading layer has a thickness of about 500-5000 Å.

10. The system of claim 8, wherein the first layer has a thickness of about 100-800 Å.

11. The system of claim 8, wherein the second layer has a thickness of about 50-200 Å.

12. The system of claim 8, wherein the third layer has a thickness of about 100-500 Å.

13. The system of claim 8, wherein the adhesive layer comprises about 6-50 alternating layers.

14. The system of claim 8, wherein the second current spreading layer is composed of a same material as the first current spreading layer.

\* \* \* \* \*